US010931265B1

(12) United States Patent
Zhao

(10) Patent No.: US 10,931,265 B1
(45) Date of Patent: Feb. 23, 2021

(54) PWM SIGNAL GENERATION AND ERROR CALIBRATION CIRCUIT

(71) Applicant: SI EN TECHNOLOGY (XIAMEN) LIMITED, Xiamen (CN)

(72) Inventor: Dongshi Zhao, Xiamen (CN)

(73) Assignee: SI EN TECHNOLOGY (XIAMEN) LIMITED, Fujian (CN)

( * ) Notice: Subject to any disclaimer, the term of this patent is extended or adjusted under 35 U.S.C. 154(b) by 0 days.

(21) Appl. No.: 16/677,543

(22) Filed: Nov. 7, 2019

(30) Foreign Application Priority Data

Aug. 19, 2019 (CN) .......................... 201910764313.7

(51) Int. Cl.
*H03K 3/017* (2006.01)
*H05B 45/37* (2020.01)

(52) U.S. Cl.
CPC ............. *H03K 3/017* (2013.01); *H05B 45/37* (2020.01)

(58) Field of Classification Search
CPC ........... H03K 3/017; H03K 7/08; H05B 45/37
See application file for complete search history.

(56) References Cited

U.S. PATENT DOCUMENTS 10,003,328 B1 * 6/2018 Yin ..................... H03K 5/156
10,470,265 B1 * 11/2019 Zhao ..................... H05B 45/10

\* cited by examiner

*Primary Examiner* — Patrick O Neill
(74) *Attorney, Agent, or Firm* — Leong C. Lei

(57) ABSTRACT

A PWM signal generation and error calibration circuit includes an amplifier OP1, an amplifier OP2, a comparator CMP1, a comparator CMP2, PMOS field-effect transistors M1-M16, a resistor R14, a resistor R_FRE, variable resistors R15-R16, a resistor R17, a capacitor C1, a matched resistance module circuit, a current drain IDC, and a 14-bit counter. The PWM signal generation and error calibration circuit saves chip costs and supports a wide PWM signal frequency range, while being able to calibrate all duty cycle errors of PWM signals in the range between 0% and 100% with improved accuracy.

2 Claims, 10 Drawing Sheets

PWM SIGNAL GENERATION AND ERROR CALIBRATION CIRCUIT

BACKGROUND OF THE INVENTION

1. Technical Field

The present invention relates to a circuit that generates pulse width modulation signals.

2. Description of Related Art

Pulse width modulation, or PWM in short, is a technology extensively applied in the field of automotive electronics. A voltage signal used to provide pulse width modulation is known as a PWM signal. PWM signals can be generally adjusted in terms of frequency and duty ratio.

Lamps at the tail of a vehicle, such as high-energy-efficiency LED signal lamps, are usually configured to be switched between two modes, namely the brake mode and the taillight mode. Generally, LEDs are powered by a chip equipped with a constant current source that supplies a stable current reliably, with the LEDs acting as the loads of the chip. In a car, when the brake is applied, LED lamps operate in the brake mode, in which a direct current driving the LEDs is relatively large, the LED lamps are highly bright to prompt drivers of other cars to decelerate. When the brake is not applied, the LED lamps operate in the taillight mode, in which the current supplied is reduced by means of, for example, PWM dimming.

The use of PWM in regulation of LED currents is generally realized in two ways.

The first way is known as PWM-based external control that is achieved using a constant current source chip. As shown in FIG. 1, an MCU outputs a PWM control signal connected to the enable end of a constant current source chip for controlling an LED current. When the PWM signal is at a high level, the constant current source outputs a current. When the PWM signal is at a low level, the constant current source does not output a current. The MCU controls the average current of the LEDs by adjusting the duty ratio, i.e. the time ratio of the high-level operation to the entire operation, thereby adjusting the connected LED(s) in terms of brightness. The MCU may also be configured to adjust the frequency of the PWM signal.

The second way is referred to PWM-based internal control that is also achieved using a constant current source chip. As shown in FIG. 2, instead of using an MCU as described previously, the constant current source chip integrates therein a PWM signal generator circuit. The constant current source chip is provided with mode control pins for setting the constant current source output current into the brake mode, in which a constant current is output, or the taillight mode, in which a PWM pulse current is output. Where the taillight mode is chosen, the output is a PWM pulse current. The duty ratio of the PWM pulse current depends on the set voltage of a dedicated input pin (or a duty ratio setting pin) on the chip, and the frequency of the PWM pulse current is determined by the resistance level between another dedicated pin (or a frequency ratio setting pin) of the chip and the ground. In the prior art, the PWM-based internal control as described previously are typically implemented using either of two approaches.

The first approach to PWM-based internal control is as shown in FIG. 3. The chip used for this purpose integrates internally a PWM signal generator circuit whose internal PWM signal generation timing is as shown in FIG. 4.

When the source current I charges the capacitor C, the capacitor C has its voltage increasing continuously, and when the voltage of the capacitor C is higher than V_MAX, the field-effect transistor NMOS1 is on so that the capacitor C discharges at its two ends, making the voltage of the capacitor C return to 0V.

As in this circuit scheme, the frequency of the PWM signal is determined by the capacitor C and the current I, when the PWM frequency is set low, a relatively large capacitor is dictated.

For example, assuming that the PWM frequency is F=200 Hz, I=1 uA, and V_MAX=3V, according to $$I * \frac{1}{F} = C * V\_MAX,$$

it is figured out that $$C = \frac{1 \ \mu A \times 5 \ ms}{3V} = 1670 \ pF.$$

A capacitor of 1670 pF takes much space in the overall layout and requires more cost. In addition, since the current of 1 uA is relatively small, the error among chips can be relatively significant.

The second approach to PWM-based internal control is as shown in FIG. 5. In this approach, RF and RDC are resistor elements outside the chip. $R_F$ determines the frequency for PWM, and $R_{DC}$ determines the duty ratio for PWM.

An 8-bit ADC is used to convert the voltage of $R_{DC}$ to an 8-bit digital signal, which works with the clock CLK controlled by $R_F$ to generate a counter. The count value of the counter is the same as the 8-bit ADC and compared against 256, thereby generating the PWM signal.

The larger $R_F$ leads to the lower CLK frequency and in turn the lower PWM frequency; and The larger $R_{DC}$ leads to the greater ADC conversion result and in turn the greater PWM duty ratio.

In this scheme, the duty ratio of the PWM signal is less precise, with a theoretical maximum value as low as 1/256=0.4%. Moreover, the theoretical PWM duty ratio is subject to instability. Assuming that the set duty ratio is right 1.2%, and the voltage of the $R_{DC}$ when converted by the ADC generates a value right on the threshold between 2 and 3, the ADC conversion result may be 3 or 2. In this case, the duty ratio for PWM may be 0.8% or 1.2%, so the average current of the LED may suffer a jitter up to 50%.

SUMMARY OF THE INVENTION

The primary objective of the present invention is to provide a PWM signal generation and error calibration circuit that features for improved precision and reduced manufacturing costs and is designed for the foregoing PWM-based internal control.

To achieve the aforementioned objective, the present invention implements the following technical schemes.

The PWM signal generation and error calibration circuit comprises an amplifier OP1, an amplifier OP2, a comparator CMP1, a comparator CMP2, PMOS field-effect transistors M1-M16, a resistor R14, a resistor R_FRE, variable resistors R15-R16, a resistor R17, a capacitor C1, a matched resistance module circuit, a current drain IDC, and a 14-bit counter;

the amplifier OP1 having a positive input terminal thereof connected to a reference voltage VREF1 and having an output terminal thereof connected to a gate of the PMOS field-effect transistor M15; the PMOS field-effect transistors M1, M2, M15 and the resistor R14 being connected in series between a power source VCC and a ground; the amplifier OP1 having a negative input terminal thereof connected between the PMOS field-effect transistor M15 and the resistor R14;

the PMOS field-effect transistors M3, M4 and the variable resistor R15 being connected in series between the power source VCC and the ground;

the PMOS field-effect transistors M5, M6 and the variable resistor R16 being connected in series between the power source VCC and the ground;

the PMOS field-effect transistor M7 and the PMOS field-effect transistor M8 jointly forming a PMOS folded cascode current source; the PMOS field-effect transistors M7, M8, M16 being connected in series between the power source VCC and a relevant input node of the matched resistance module circuit;

gates of the PMOS field-effect transistors M1, M3, M5 and M7 being connected to a drain of the PMOS field-effect transistor M15, respectively; gates of the PMOS field-effect transistors M2, M4, M6 and M8 being connected to a bias voltage VREF2 of the folded cascode current source;

the amplifier OP2 having a positive input terminal thereof connected to V3 which is a setting voltage for setting a frequency for a triangle wave, the amplifier OP2 having an output terminal thereof connected to a gate of the PMOS field-effect transistor M14; the PMOS field-effect transistors M9, M10, M14 and the resistor R_FRE being connected in series between the power source VCC and the ground; the amplifier OP2 having a negative input terminal connected between the PMOS field-effect transistor M14 and the resistor R_FRE, and the amplifier OP2 having the negative input terminal further connected to the current drain IDC which is used to set a PWM frequency of the resistor R_FRE that is in an open-circuit state;

the PMOS field-effect transistor M11 and the PMOS field-effect transistor M12 forming a PMOS folded cascode current source by being paired and symmetrically matched across the PMOS field-effect transistor M9; the PMOS field-effect transistors M11, M12, M13 being connected in series between the power source VCC and the relevant input node of the matched resistance module circuit;

gates of the PMOS field-effect transistors M9 and M11 being connected to a drain of the PMOS field-effect transistor M14, respectively; gates of the PMOS field-effect transistors M10 and M12 being connected to a bias voltage VREF3 of the folded cascode current source, respectively; and the 14-bit counter having 14 output terminals thereof correspondingly connected to gates of 14 tubes of the PMOS field-effect transistor M13, respectively; the PMOS field-effect transistor M13 having 14 output terminals thereof connected to 14 input nodes of the matched resistance module circuit, respectively; the PMOS field-effect transistor M13 having the output terminals thereof further connected to an input terminal of an RC filter circuit whose output is connected to a negative input terminal of the comparator CMP1 and a positive input terminal of the comparator CMP2; the comparator CMP1 having a positive input terminal thereof connected to a voltage V1 which the maximum voltage to set the triangle wave; the comparator CMP1 having an output terminal thereof connected to a reset terminal of the 14-bit counter; the comparator CMP2 having a negative input terminal thereof connected to a duty ratio setting pin; and the comparator CMP2 outputting a PWM signal at an output terminal thereof.

The PMOS field-effect transistors M1-M8 each have an even number of tubes, and have such a layout that M1 and M2 are centered and flanked from two sides by M3, M4, M5 and M6, M7, M8 successively, in which the PMOS field-effect transistors M1, M3, M5, M7 are symmetrically matched across a geometric center in the layout while the PMOS field-effect transistors M2, M4, M6, M8 are symmetrically matched across the geometric center in the layout.

In the prior art, generation of PWM signals involves generating triangle waves by means of charging and discharging a capacitor with a current source. For larger coverage of the PWM frequency, the current source used has to have a large variation range, which comes with larges error and makes the resulting product inferior in terms of precision. Opposite to existing solutions, the PWM signal generation and error calibration circuit of the present invention employs variable resistors to generate a triangle-wave voltage with a variable current and thus requires less current variation from the current source. As a result, only a relatively small capacitor is sufficient to generate PWM signals with relatively low frequencies, and this helps to save layout space as well as chip costs while accommodating a broader frequency range of PWM signals. Additionally, the present invention calibrates the duty ratio function by considering the PWM signal duty ratio at two voltage points, so as to more accurately calibrate the PWM signal and cover all duty cycle errors in the range between 0% and 100%.

DETAILED DESCRIPTION OF THE INVENTION

Figure 1:
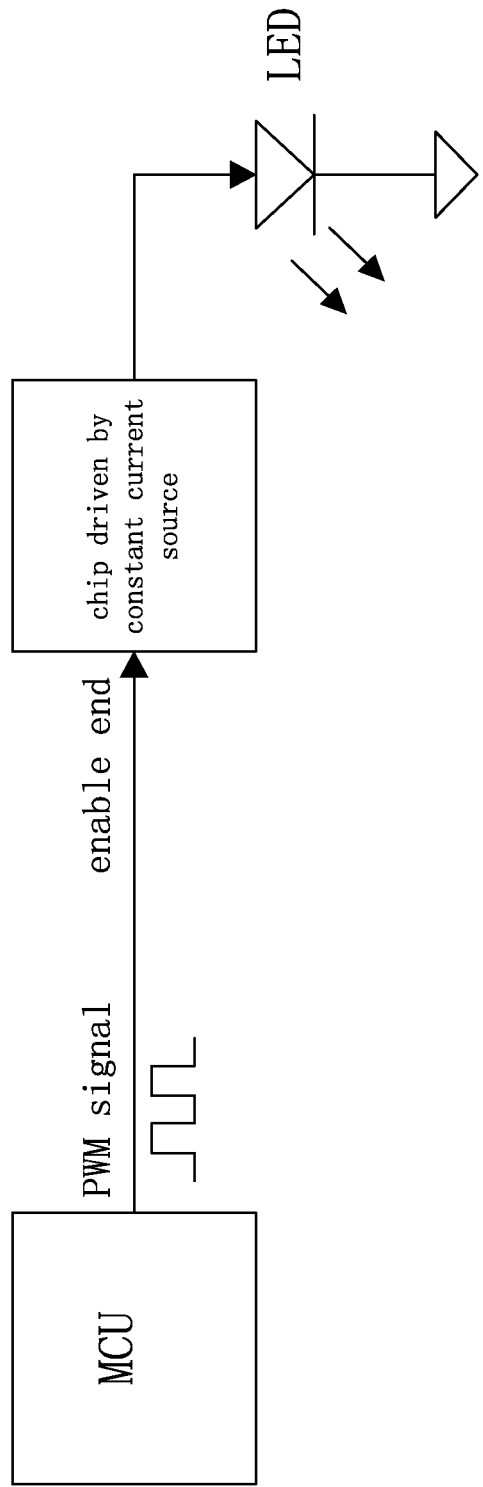
FIG. 1 is a schematic circuit diagram illustrating conventional PWM-based external control using a constant current source chip.
Figure 2:
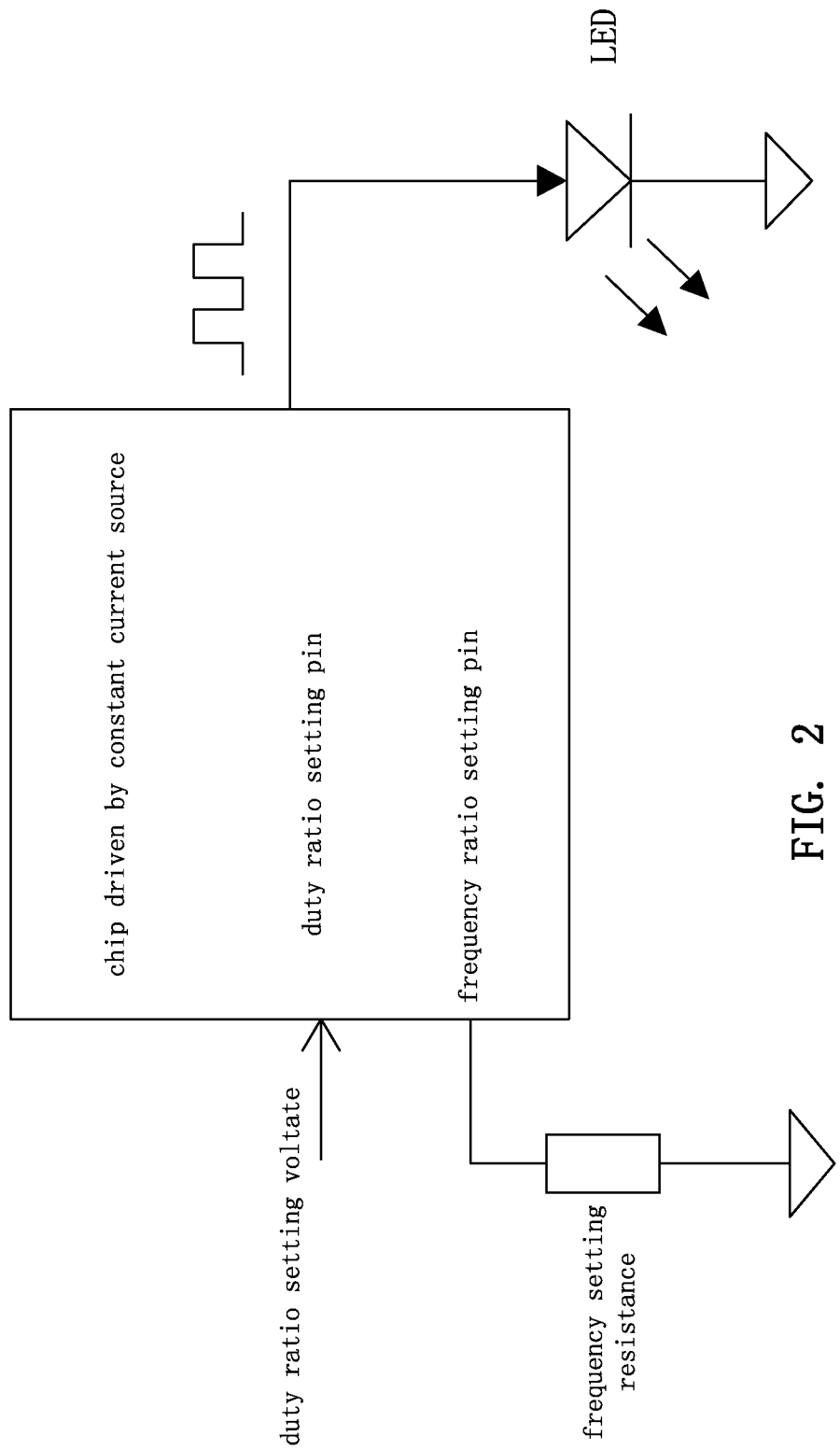
FIG. 2 is a schematic circuit diagram illustrating conventional PWM-based internal control using a constant current source chip.
Figure 3:
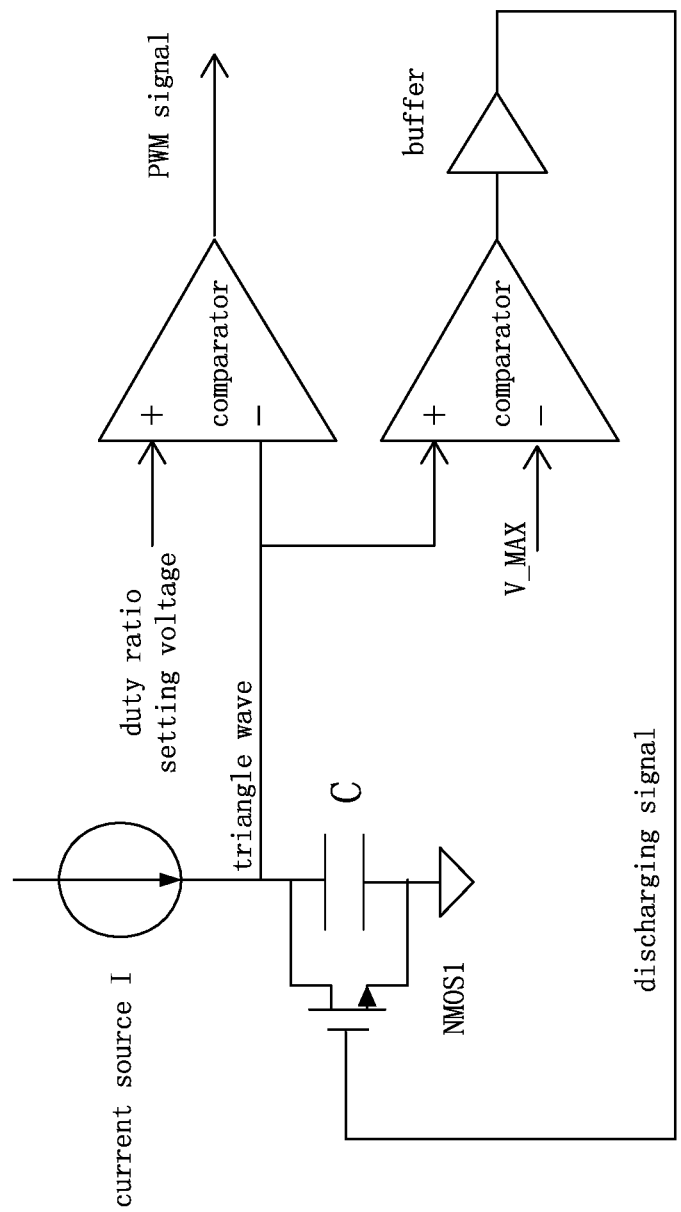
FIG. 3 is a schematic circuit diagram of a conventional internal PWM signal generation circuit.
Figure 4:
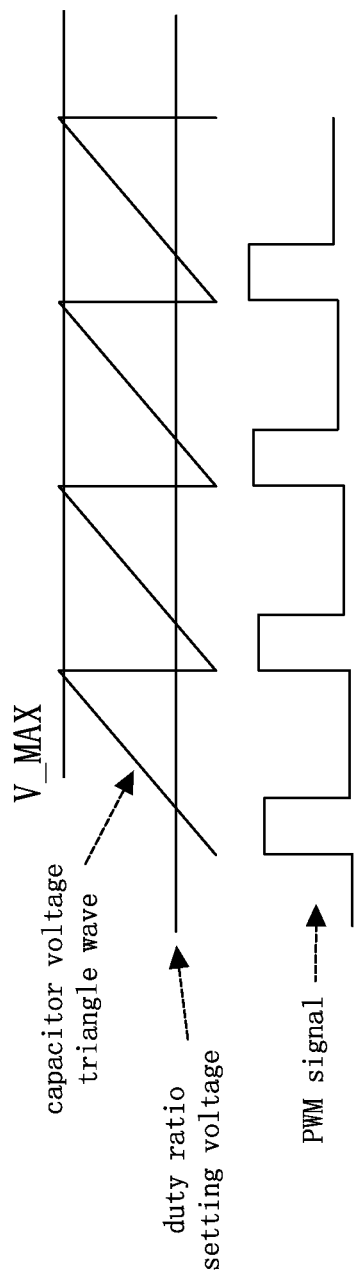
FIG. 4 is a timing diagram of a conventional internal PWM signal generation circuit.
Figure 5:
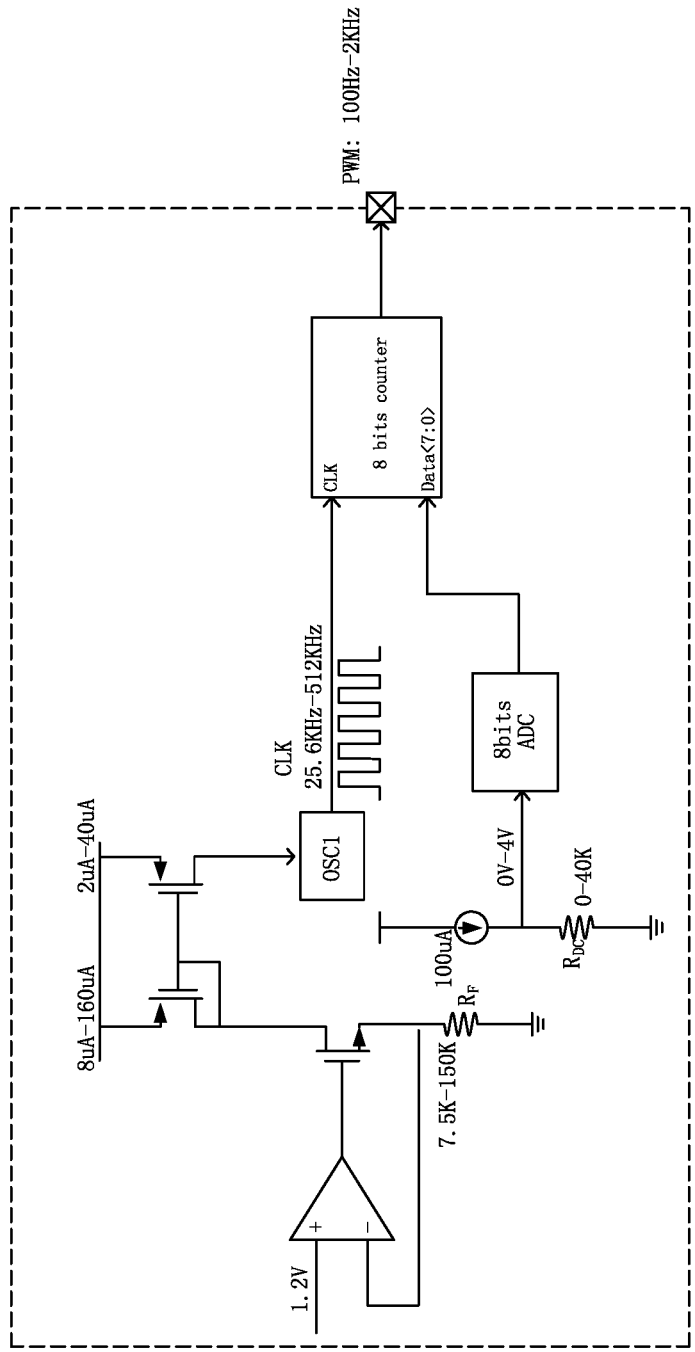
FIG. 5 is a schematic circuit diagram of another conventional internal PWM signal generation circuit.
Figure 6:
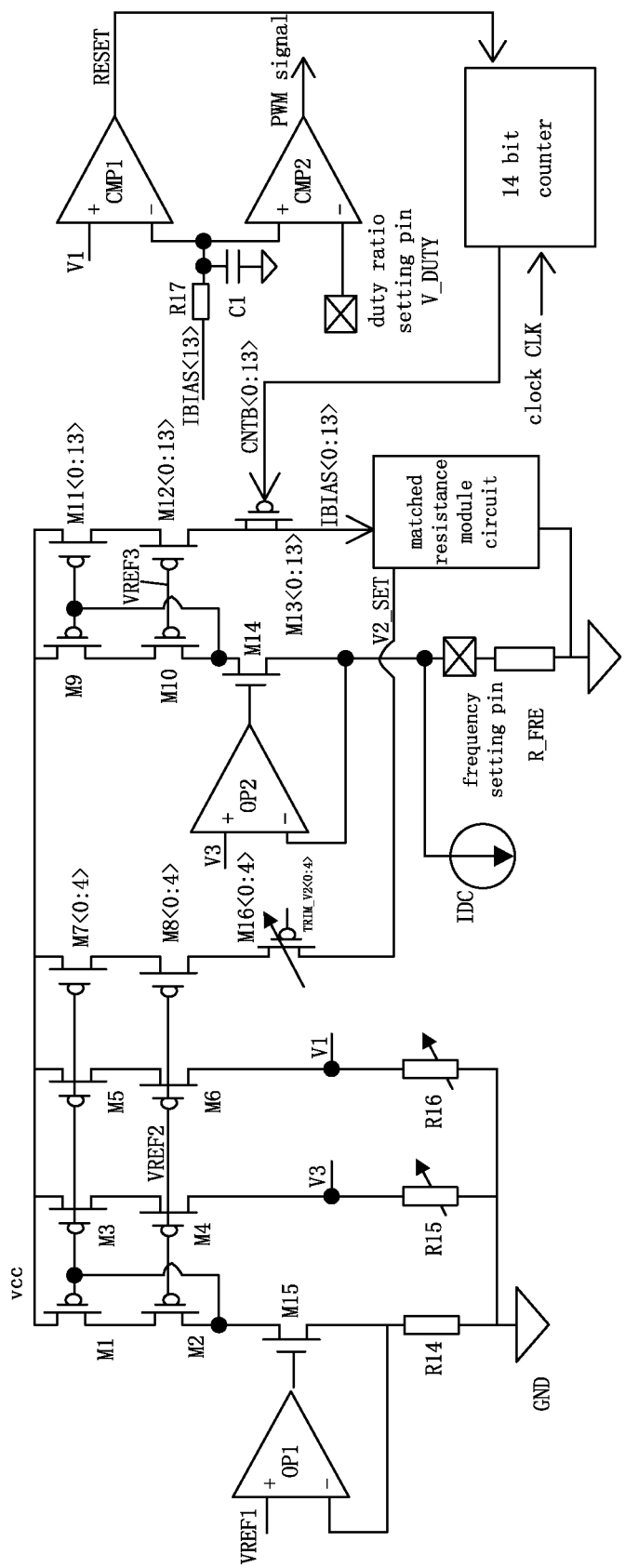
FIG. 6 is a circuit diagram of a PWM signal generation and error calibration circuit of the present invention.
Figure 7:
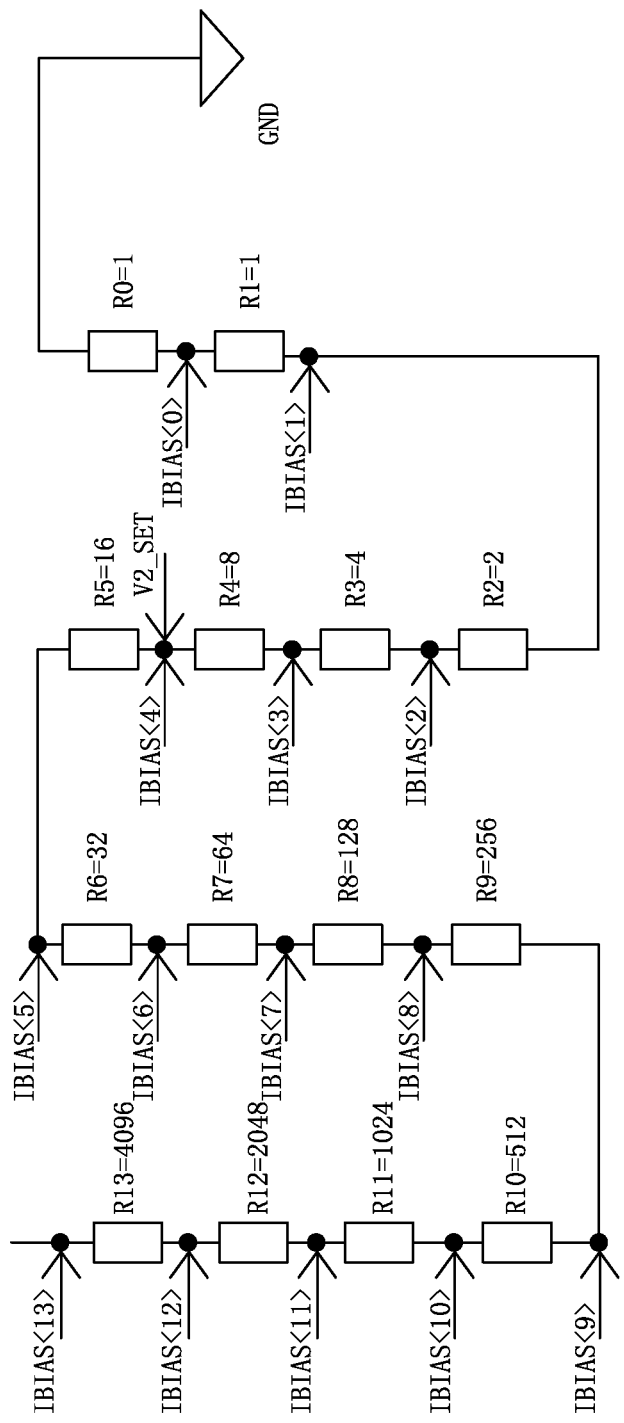
FIG. 7 is a schematic circuit diagram of the matched resistance module circuit shown in FIG. 6.
Figure 8:
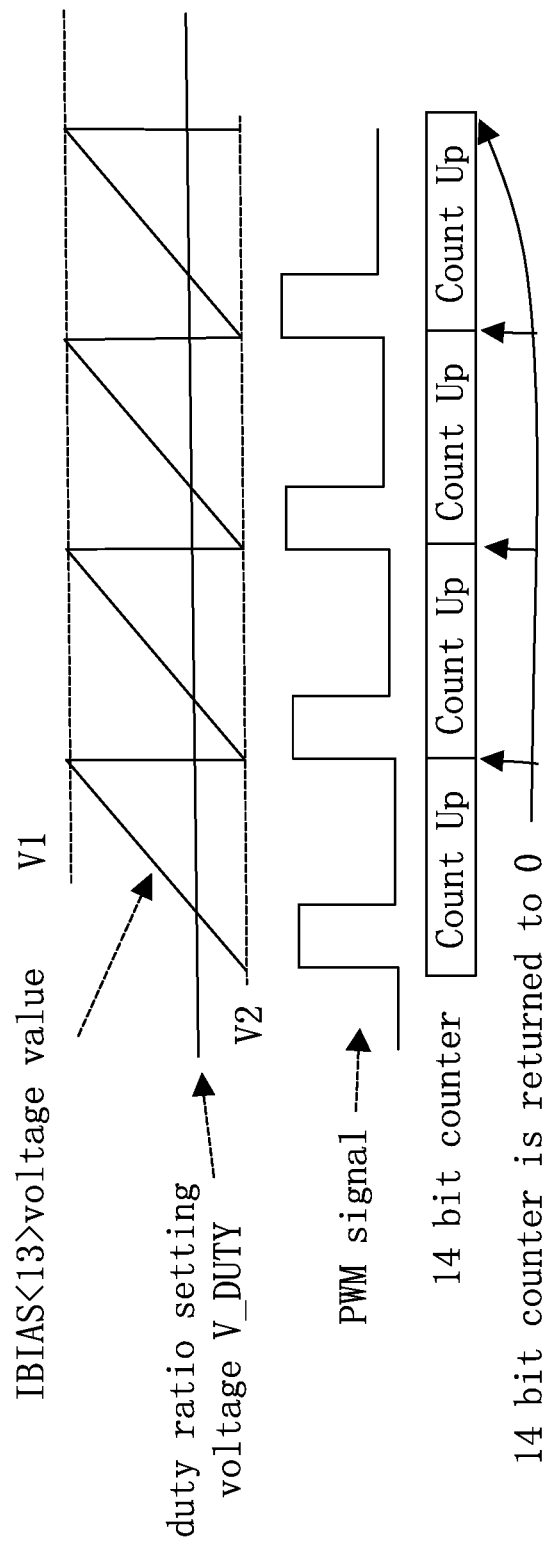
FIG. 8 is a timing diagram of the PWM signal generation circuit of the present invention.

According to the present invention, a PWM signal generation and error calibration circuit, as shown in FIG. 6, FIG. 7, FIG. 8, comprises an amplifier OP1, an amplifier OP2, a comparator CMP1, a comparator CMP2, PMOS field-effect transistors M1-M16, a resistor R14, a resistor R_FRE, variable resistors R15-R16, a resistor R17, a capacitor C1, a matched resistance module circuit, a current drain IDC, and a 14-bit counter.

The amplifier OP1 has its positive input terminal connected to a reference voltage VREF1 (that may be set as 1.2V). The amplifier OP1 has its output terminal connected to the gate of the PMOS field-effect transistor M15. The PMOS field-effect transistors M1, M2, M15 and the resistor R14 are connected in series between the power source VCC and the ground. The amplifier OP1 has its negative input terminal connected between M15 and the resistor R14.

The PMOS field-effect transistors M3, M4 and the variable resistor R15 are connected in series between the power source VCC and the ground. The PMOS field-effect transistor M4 and the variable resistor R15 are at a joint therebetween connected to V3.

The PMOS field-effect transistors M5, M6 and the variable resistor R16 are connected in series between the power source VCC and the ground. The PMOS field-effect transistor M6 and the variable resistor R16 are at a joint therebetween connected to V1.

The PMOS field-effect transistor M7 and the PMOS field-effect transistor M8 form a PMOS folded cascode current source. The PMOS field-effect transistors M7, M8, M16 are connected in series between the power source VCC and the input node IBIAS<4> of the matched resistance module circuit.

The PMOS field-effect transistors M1, M3, M5 and M7 have their gates connected to the drain of the PMOS field-effect transistor M15, respectively. The PMOS field-effect transistor M2, M4, M6 and M8 have their gates connected to the bias voltage VREF2 of the folded cascode current source, respectively. VREF2 is set as VCC-M1Von-M2Von-Vth, where M1Von and M2Von are overdrive voltages of the PMOS field-effect transistor M1 and the PMOS field-effect transistor M2, respectively, and Vth is the threshold voltage of the PMOS field-effect transistor M1.

The amplifier OP2 has its positive input terminal connected to V3 and the amplifier OP2 has its output terminal connected to the gate of the PMOS field-effect transistor M14. The PMOS field-effect transistors M9, M10, M14 and the resistor R_FRE are connected in series between the power source VCC and the ground. The amplifier OP2 has its negative input terminal connected between M14 and the resistor R_FRE, and further connected to the current drain IDC which is used to set a PWM frequency of the resistor R_FRE that is in an open-circuit state.

The PMOS field-effect transistor M11 and the PMOS field-effect transistor M12 form a PMOS folded cascode current source by being paired and symmetrically matched across the PMOS field-effect transistor M9. The PMOS field-effect transistors M11, M12, M13 are connected in series between the power source VCC and the input node IBIAS<13> of the matched resistance module circuit. The input node IBIAS<4> of the matched resistance module circuit is connected to V2_SET (hereinafter referred to as V2).

The gates of the PMOS field-effect transistors M9 and M11 are connected to a drain of the PMOS field-effect transistor M14, respectively. The gates of the PMOS field-effect transistors M10 and M12 are connected to a bias voltage VREF3 of the folded cascode current source, respectively.

As shown in FIG. 6, the amplifier OP1, the PMOS field-effect transistor M15 and the resistor R14 form a loop, generating a reference current that flows through the resistor R14 to GND. The PMOS field-effect transistor M1 and the PMOS field-effect transistor M2 have the same reference current flowing therethrough:

$$I\_R1 = \frac{VREF1}{R1}, \tag{1}$$

Each of the PMOS field-effect transistors M1-M8 has an even number of tubes. In terms of layout, M1 and M2 are centered and flanked from two sides by M3, M4, M5 and M6, M7, M8 successively. The PMOS field-effect transistors M2, M4, M6, M8 are symmetrically matched across the geometric center in the layout. Since such a geometric-center based arrangement is well known in IC design, no further details thereof will be given in this disclosure.

Specifically, the PMOS field-effect transistor M1 has 8 tubes (number, m=8). A single PMOS field-effect transistor M1 has a width length ratio W/L=3u/3u.

The number of the PMOS field-effect transistors M3 is 2. A single PMOS field-effect transistor M3 has a width length ratio W/L=3u/3u.

The number of the PMOS field-effect transistors M5 is 8. A single PMOS field-effect transistor M5 has a width length ratio W/L=3u/3u.

The PMOS field-effect transistor M7 has five sets of devices, with a width length ratio W/L=3u/3u; M7<0> having a number of tubes, m=2; M7<1> having a number of tubes, m=4; M7<2> having a number of tubes, m=8; M7<3> having a number of tubes, m=16; and M7<4> having a number of tubes, m=32.

The number of the PMOS field-effect transistors M2 is 8. A single PMOS field-effect transistor M2 has a width length ratio W/L=3u/1u.

The number of the PMOS field-effect transistors M4 is 2. A single PMOS field-effect transistor M4 has a width length ratio W/L=3u/1u.

The number of the PMOS field-effect transistors M6 is 8. A single PMOS field-effect transistor M6 has a width length ratio W/L=3u/1u.

The PMOS field-effect transistor M8 has 5 sets of devices; M8<0> having a number of tubes, m=2; M8<1> having a number of tubes, m=4; M8<2> having a number of tubes, m=8; M8<3> having a number of tubes, m=16; and M8<4> having a number of tubes, m=32.

The PMOS field-effect transistors M1, M3, M5, and M7 are symmetrically matched across the geometric center in the layout;

$$V1 = \frac{VREF1}{R1} * m1 * R3, \; V3 = \frac{VREF1}{R1} * m2 * R2, \tag{2}$$

where m1 is the PMOS channel width ratio of the PMOS field-effect transistor M5 to the PMOS field-effect transistor M1, which is 8/8=1, and m2 is the channel width ratio of the PMOS field-effect transistor M3 to the PMOS field-effect transistor M1, which is 2/8=1/4. The variable resistor R15 and the variable resistor R16 are symmetrically matched across the geometric center in the layout. By adjusting the resistance levels of the variable resistors R15, R16, the voltage values of V3 and V1 can be calibrated, wherein V1 is the maximum voltage to set the triangle wave and V3 is the voltage to set the frequency of the triangle wave.

The PMOS field-effect transistor M7 and the PMOS field-effect transistor M8 form a folded cascode current source comprising 5 sets of PMOS current sources. By turning on or off the 5 PMOS field-effect transistors of the PMOS field-effect transistors M16<0:4>, the current from V2_SET can be calibrated, thereby calibrating the voltage of V2_SET.

Similarly, the amplifier OP2, the PMOS field-effect transistor M14 and the resistor R_FRE form another loop, generating another current that flow through the resistor R_FRE to GND. The PMOS field-effect transistors M9, M10 and the resistor R_FRE have the same current flowing therethrough.

The PMOS field-effect transistors M12<0:13> and the PMOS field-effect transistors M11<0:13> form 14 sets of PMOS folded cascode current sources that are each symmetrically matched across the PMOS field-effect transistor M9. The PMOS field-effect transistor M10 and the PMOS field-effect transistor M12 are set with an appropriate bias voltage VREF3 (VREF3 is the bias voltage of the folded cascode current source, set as VCC-M9Von-M10Von-Vth, where M9Von and M10Von are overdrive voltages for the PMOS field-effect transistor M9 and the PMOS field-effect transistor M10, respectively, and Vth is the threshold voltage of the PMOS field-effect transistor M1).

All of the 14 current sources of M11 and M12 output the same current value. In other words, the 14 PMOS field-effect transistors M11<0>, M11<1>, M11<2>, ..., M11<13> have the same width length ratio, and the 14 PMOS field-effect transistors M12<0>, M12<1>, M12<2>, M12<13> have the same width length ratio. The 14 current sources each have a current value of I_M11<X>:

$$I\_M11<X> = \frac{V3}{R_{FRE}} * m3, \quad (3)$$

where m3 is the PMOS channel width ratio of the PMOS field-effect transistor M11<0> to the PMOS field-effect transistor M9. The 14 PMOS field-effect transistors M11<0>, <1>-<13> have the same channel width.

As shown in FIG. 8, the PWM signal is generated by comparing a triangle wave and a duty ratio setting voltage. V1 is the maximum voltage to set the triangle wave. V2 is the minimal voltage to set the triangle wave. V3 is the voltage to set the frequency of the triangle wave.

The clock of the 14-bit counter is a CLK input signal, and the output signal of the 14-bit counter is negation signals CNTB<0:13> for the count value. CNTBs<0:13> are correspondingly connected to the gates of the PMOS field-effect transistors M13<0:13>. In other words, CNTB<x> is connected to the gate of M13<x>, where x=0, 1, 2, ..., 13. Through CNTBs<0:13>, the voltages at the gates of the 14 PMOS field-effect transistors M13<0:13> can be controlled. The outputs of the PMOS field-effect transistors M13<0:13> are 14 lines, written as IBIASs<0:13>. The IBIASs<0:13> are connected to 14 input nodes of the matched resistance module circuit, respectively (as shown in FIG. 7). In other words, the output terminal (drain) of M13<x> is connected to the IBIAS<x> terminal, where x=0, 1, 2, ..., 13. Therein, IBIAS<13> is further connected to the input of an RC filter composed of the resistor R17 and the capacitor C1. This RC filter has its output connected to the negative input terminal of the comparator CMP1 and the positive input terminal of the comparator CMP2. The comparator CMP1 has its positive input terminal connected to V1. The output signal of the comparator CMP1 is written as RESET. The RESET signal is connected to the reset terminal of the 14-bit counter.

RESET is active high. When RESET is at a high level, the cardinality of the counter is returned to 0. The comparator CMP2 has its negative input terminal connected to the duty ratio setting pin, and the output terminal of the comparator CMP2 outputs a PWM signal.

The matched resistance module circuit, as shown in FIG. 7, includes 14 resistors R0-R13. The 14 resistors are symmetrically matched across a geometric center of the overall layout. Since such a symmetrically matched arrangement is well known in IC design, no further details thereof will be given in this disclosure. The resistors R0-R13 have a resistance ratio of 1:1:2:4:8:16:32:64:128:256:512:1024:2048:4096.

The PWM signal output by the comparator CMP2 has a frequency F_PWM:

$$F\_PWM = \frac{1}{T\_CLK} \times \frac{\left(\frac{V3}{R\_FRE} + IDC\right) * m3}{V1 - V2} \quad (4)$$

where, T_CLK is the cycle of the clock input signal CLK; IDC is the input current value of the current drain; m3 is the PMOS channel width ratio of the PMOS field-effect transistor M11<0> to the PMOS field-effect transistor M9.

The PWM signal has a duty ratio D PWM:

$$D_{PWM} = \frac{V_{DUTY} - V2}{V1 - V2} = \frac{1}{V1 - V2} V_{DUTY} + \frac{V2}{V2 - V1}, \quad (5)$$

where, V2=I_V2_SET*(R0+R1+R2+R3+R4); and $V_{DUTY}$ is a duty ratio setting voltage. The resistors R0-R4 are the relevant resistors in the matched resistance module circuit, and I_V2_SET is the current value of the current source controlled by the PMOS field-effect transistor M13 and flowing to the matched resistance module circuit.

In operation, as shown in FIGS. 6 through 8, initially, when the count value of the 14-bit counter is 0, the IBIAS<13> voltage is V2, about 0.2V. Then the count value of the 14-bit counter starts to increase. When the count value is 1, the PMOS field-effect transistor M13<0> is on, and the 1 uA current of IBIAS<0> flows out. When the count value is 2, the PMOS field-effect transistor M13<1> is on, and the 1 uA current of IBIAS<1> flows out. When the count value is 3, the PMOS field-effect transistor M13<1> and the PMOS field-effect transistor M13<0> are on, so the 1 uA currents of IBIAS<1> and IBIAS<0> flow out, and so on. As the count value of the 14-bit counter increases, the IBIAS<13> voltage increases to form a linearly raising voltage waveform, as the waveform of the IBIAS<13> voltage shown in FIG. 8. When the IBIAS<13> voltage reaches the V1 voltage, the output signal RESET of the comparator CMP1 becomes low, making RESET become low to zero the count value of the 14-bit counter. At this time, the voltage of IBIAS<13> returns to the V2 voltage. Then the count value of the 14-bit counter starts to increase, and the IBIAS<13> voltage starts to raise linearly as stated previously, so IBIAS<13> forms a triangle wave. The duty ratio setting voltage V_DUTY and the IBIAS<13> voltage are input to the positive and negative input terminals of the comparator CMP2. The output terminal of the comparator CMP2 generates the PWM signal. Therein, the higher the V_DUTY voltage is, the greater the duty ratio of the PWM signal is, and the lower the V_DUTY voltage is, the smaller the duty ratio of the PWM signal is.

Figure 9:
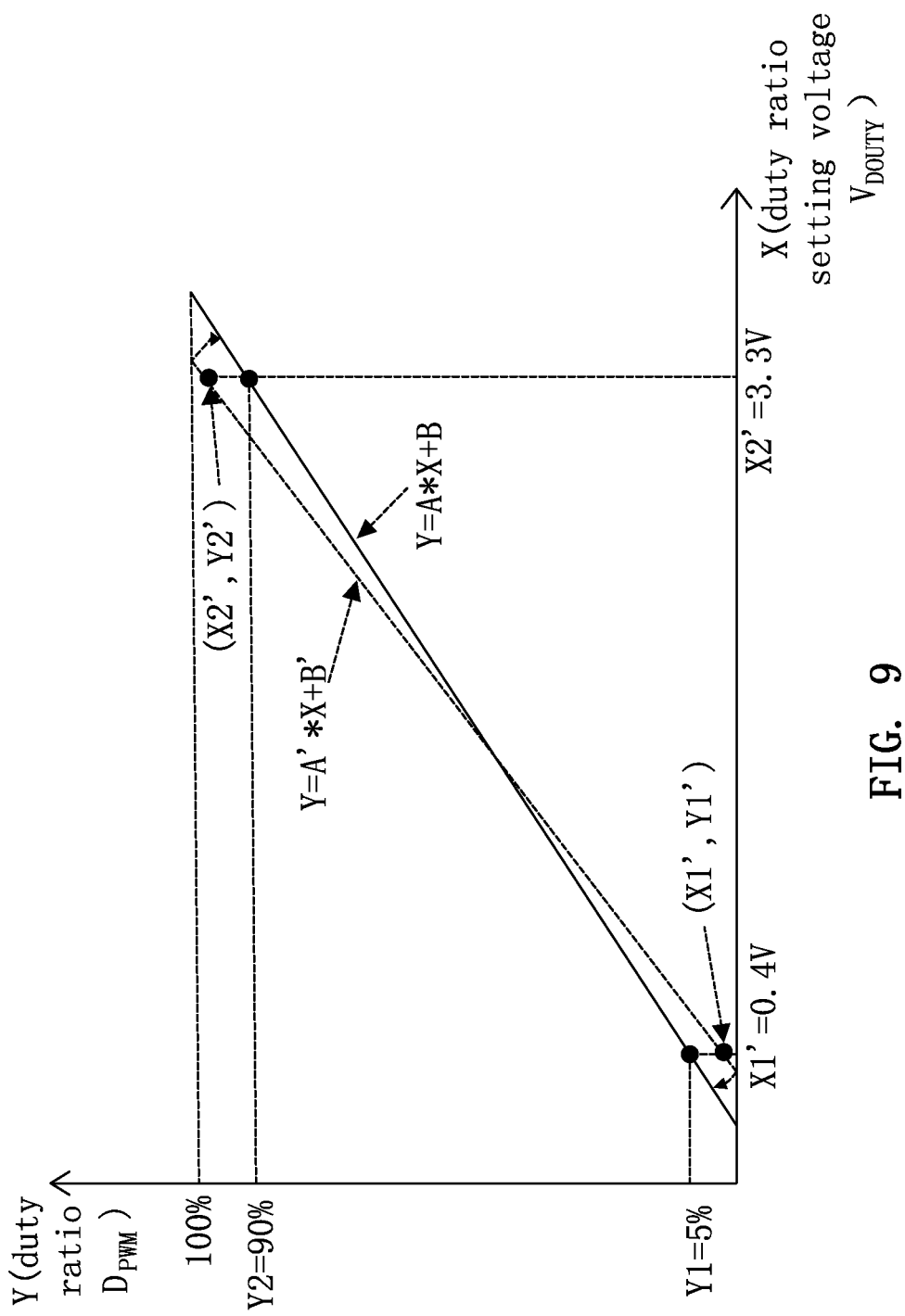
FIG. 9 is a function graph showing the relationship between a PWM signal duty ratio and a voltage set therefor according to the present invention.

In the present invention, the PWM signal generation circuit makes calibration in the way as shown in FIG. 9.

As a first part, the voltage values of V1 and V2 are adjusted to correct errors in the duty ratio of the PWM signal.

For simplicity and clarity, the duty ratio $D_{PWM}$ of the PWM signal output by the PWM signal generation circuit is hereinafter simplified as Y and the duty ratio setting voltage $V_{DUTY}$ is simplified as X, so Equation (5) can be rewritten as:

$$D_{PWM} = \frac{V_{DUTY} - V2}{V1 - V2} = \frac{1}{V1 - V2}V_{DUTY} + \frac{V2}{V2 - V1}, \quad (5)$$

Equation (5) may be alternatively written as Equation (6):

$$Y = AX + B \quad (6)$$

where, $$\begin{cases} A = \dfrac{1}{V1 - V2} \\ B = \dfrac{V2}{V2 - V1} \end{cases}, Y = D_{PWM}, X = V_{DUTY}. \quad (7)$$

From Equation (7), the target values of V1 and V2 are:

$$\begin{cases} V2 = \dfrac{B}{A} \\ V1 = \dfrac{B+1}{A} \end{cases} \quad (8)$$

The duty ratio of the PWM signal and the voltage-setting functions are determined by the slope A and the intercept B. The slope A and the intercept B are in turn determined by the values of V1 and V2. Thus, the duty ratio of the PWM signal and the voltage-setting functions are eventually determined by the voltage values of V1 and V2.

Equation (8) gives the target values of V1 and V2. The purpose of calibration of duty cycle errors is to calibrate the V1' and V2' values of individual chips to V1 and V2.

A chip is picked randomly, and its duty ratio setting voltages are set as VDUTY1=X1'=0.4V and VDUTY2=X2'=3.3V. The measured duty ratios are Y1' and Y2', respectively, as shown in FIG. 9. The existence of the parameters A' and B' makes the relationship described in Simultaneous equations (9) hold.

$$\begin{cases} Y1' = A'X1 + B' \\ Y2' = A'X2 + B' \end{cases} \quad (9)$$

From Simultaneous equations (9), we get:

$$\begin{cases} A' = \dfrac{Y1' - Y2'}{X1' - X2'} \\ B' = Y1' - X1' \times \dfrac{Y1' - Y2'}{X1' - X2'} \end{cases} \quad (10)$$

From Equation (8) equation, we get:

$$\begin{cases} V2' = \dfrac{B'}{A'} \\ V1' = \dfrac{B'+1}{A'} \end{cases} \quad (11)$$

Using Equations (10) and (11), we can calculate the exact values of V1' and V2' of this chip.

According to the offset of $$\frac{V1'}{V1} - 1$$

V1' against V1, the resistance level of the variable resistor R16 in the circuit diagram of FIG. 6 is calibrated, and according to the offset $$\frac{V2'}{V2} - 1$$

of V2' against V2, the current of the PMOS field-effect transistor M16 in the circuit diagram of FIG. 6 is calibrated. When the offset between V1' and V1, and the offset between V2' and V2 are small enough, the offset of the duty ratio of the PWM signal and the voltage-setting functions of individual chips against the target functional relationship is acceptably small.

As a second part, the voltage value of V3 is adjusted to calibrate the offset of the frequency of the PWM signal.

The frequency value F_PWM of the PWM signal is expressed in Equation (4), $$F\_PWM = \frac{1}{T\_CLK} \times \frac{\left(\frac{V3}{R\_FRE} + IDC\right)*m4}{V1 - V2} \quad (4)$$

A chip is picked randomly, and the measured frequency of its PWM signal is F_PWM', while the target value of the PWM signal frequency is F_PWM. The individual chip currently tasted has a PWM error of $$\frac{F\_PWM'}{F\_PWM} - 1.$$

By adjusting the resistance level of the variable resistor R15 in FIG. 6, the voltage value of V3 can be calibrated, thereby calibrating the frequency F_PWM' of the PWM signal.

Figure 10:
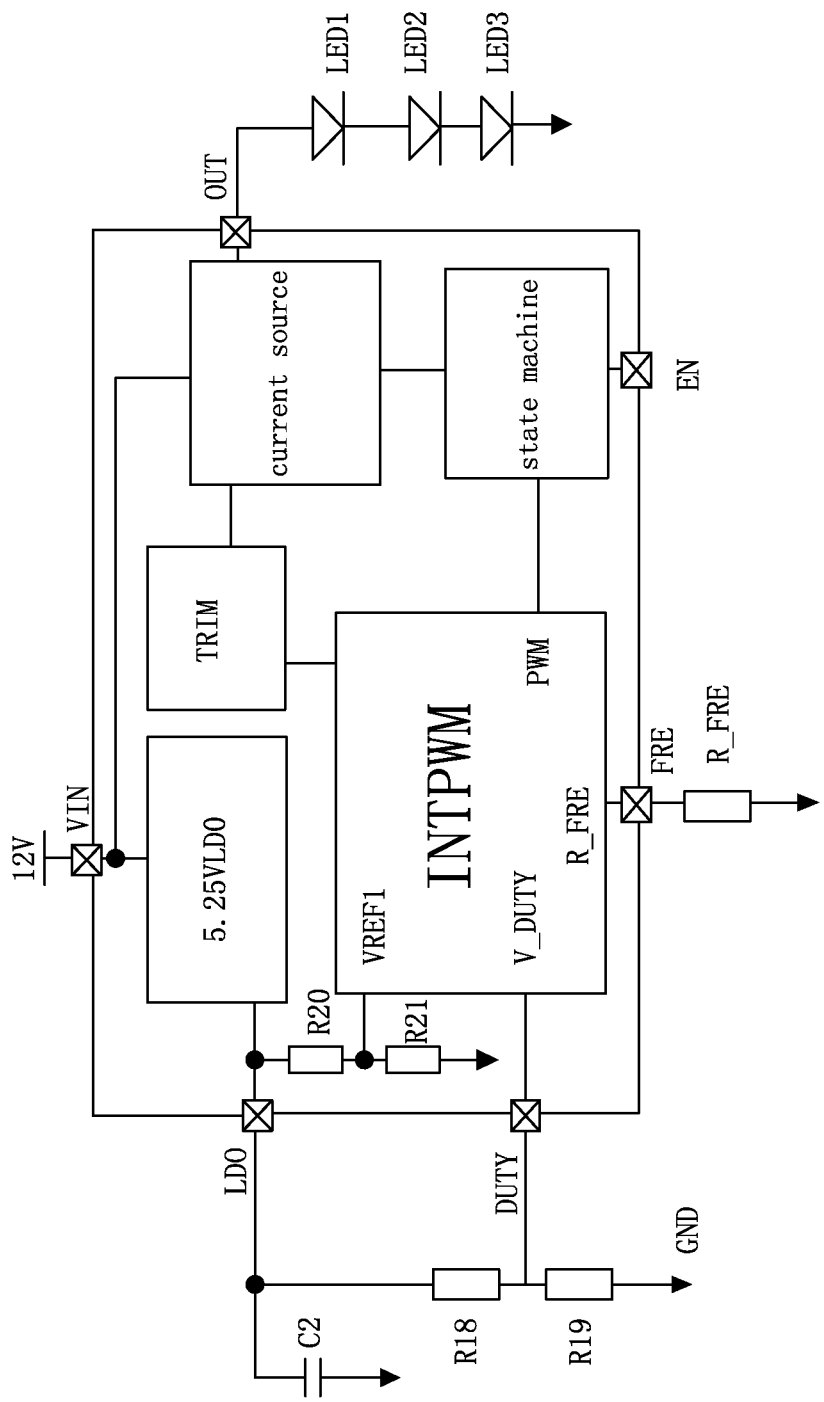
FIG. 10 is a schematic circuit diagram of an application example of the present invention.

Application Examples:

In one application example of the present invention, as shown in the circuit diagram of FIG. 10, the disclosed circuit comprises an INTPWM module, a low-dropout linear regulator (LDO) with an output voltage of 5.25V, a TRIM module (acting as a calibration data storage module), a current source module, a state machine, resistors R18-21, a resistor R_FRE, a filter capacitor C2, an LED1, an LED2 and an LED3.

The INTPWM module is an internal PWM signal generation circuit. The power source voltage VIN of the chip is connected to a 12V power source. The LDO has its output pin connected to the filter capacitor C2. The voltage output by the LDO is divided by the resistors R18 and R19 as well as by the resistors R20 and R21 and then connected to the DUTY input end of the internal PWM signal generation circuit and VREF1, respectively. The FRE pin is connected from the resistor R_FRE to GND, for setting the frequency of the PWM signal. The TRIM module is a calibration data storage module, for storing the data for calibration of V1, V2 and V3. The current source module outputs a constant current to the OUT pin. The OUT pin is externally connected three LEDs (LED1, LED2 and LED3) to GND. The state machine turns on and off of the current source, and receives the logic signal form the EN pin input.

In the prior art, a triangle wave is generated by means of charging and discharging a capacitor with a current source. For larger coverage of the PWM frequency, the current source used has to have a large variation range, such as one having a 10 pF capacitor, reference voltage=2V, 1 Mhz corresponding current I=10 pF*2V/1u S=20 uA, and 100 Hz corresponding source current I=10 pF*2V/10 mS=2 nA. It is impossible to make a 20 uA current source reduce its output to 2 nA without compromising its precision. The error would be significant and make the resulting product fail to meet precision requirements. Opposite to the prior art, the present invention employs variable resistors to generate a triangle-wave voltage with a variable current and thus requires less current variation from the current source. As a result, only a relatively small capacitor is sufficient to generate PWM signals with relatively low frequencies, and this helps to save layout space as well as chip costs while accommodating a broader frequency range of PWM signals.

In the present invention, the triangle wave voltage converted by the 14-bit DAC, connected in series with the RC filter, makes the triangle wave voltage close to a straight line. This addresses current jitter as seen in LED lamps caused by ADC quantization errors associated with the prior art. With the linear relationship between the PWM duty ratio setting voltage and the PWM duty ratio, the present invention provides improved linearity of the PWM duty ratio.

The present invention leverages the advantages of semiconductor devices in terms of layout matching, so errors in the PWM signal can be mitigated through layout matching between the resistors and CMOSes.

As shown in FIG. 9, the present invention is capable of adjusting the line segment of the duty ratio in terms of both intercept and slope, opposite to the prior art where adjustment for only the slope or only the intercept is possible. Stated differently, the traditional method only calibrates a single point, but the present invention calibrates two points at the same time. Before calibration, the line segment representing the duty ratio in FIG. 9 is straight, and after the two-point calibration the line segment remains straight. Since the two points are accurately corrected, the accuracy of the other points is ensured. The disclosed circuit calibrates the duty ratio function by considering the PWM signal duty ratio at two voltage points X1 and X2. Through adjustment made to the current V1 and the voltage V2_SET, the duty ratio functions can be calibrated, so as to more accurately calibrate the PWM signal and cover all duty cycle errors in the range between 0% and 100%.

What is claimed is:

1. A PWM signal generation and error calibration circuit, comprising a first amplifier, a second amplifier, a first comparator, a second comparator, a first, a second, a third, a fourth, a fifth, a sixth, a seventh, an eighth, a ninth, a tenth, an eleventh, a twelfth, a thirteenth, a fourteenth, a fifteenth, and a sixteenth PMOS field-effect transistors, a first resistor, a second resistor, a first and a second variable resistors, a third resistor, a first capacitor, a matched resistance module circuit, a current drain, and a 14-bit counter;

the first amplifier having a positive input terminal thereof connected to a reference voltage and having an output terminal thereof connected to a gate of the fifteenth PMOS field-effect transistor; the first, second and fifteenth PMOS field-effect transistors and the first resistor being connected in series between a power source and a ground; the first amplifier having a negative input terminal thereof connected between the fifteenth PMOS field-effect transistor and the first resistor;

the third and the fourth PMOS field-effect transistors and the first variable resistor being connected in series between the power source and the ground;

the fifth and sixth PMOS field-effect transistors and the second variable resistor being connected in series between the power source and the ground;

the seventh PMOS field-effect transistor and the eighth PMOS field-effect transistor jointly forming a PMOS folded cascode current source; the seventh, the eighth and the sixteenth PMOS field-effect transistors being connected in series between the power source and a relevant input node of the matched resistance module circuit;

gates of the first, the third, the fifth and the seventh PMOS field-effect transistors being connected to a drain of the fifteenth PMOS field-effect transistor, respectively; gates of the second, the fourth, the sixth and the eighth PMOS field-effect transistors being connected to a bias voltage of the folded cascode current source;

the second amplifier having a positive input terminal thereof connected to a setting voltage for setting a frequency for a triangle wave, the second amplifier having an output terminal thereof connected to a gate of the fourteenth PMOS field-effect transistor; the ninth, the tenth and the fourteenth PMOS field-effect transistors and the second resistor being connected in series between the power source and the ground; the second amplifier (OP2) having a negative input terminal connected between the fourteenth PMOS field-effect transistor and the second resistor, and the second amplifier having the negative input terminal further connected to the current drain, the current drain being used to set a PWM frequency of the second resistor that is in an open-circuit state;

the eleventh PMOS field-effect transistor and the twelfth PMOS field-effect transistor forming a PMOS folded cascode current source by being paired and symmetrically matched across the ninth PMOS field-effect transistor; the eleventh, the twelfth, and the thirteenth PMOS field-effect transistors being connected in series between the power source and the relevant input node of the matched resistance module circuit;

gates of the ninth and the eleventh PMOS field-effect transistors being connected to a drain of the fourteenth PMOS field-effect transistor, respectively; gates of the tenth and the twelfth PMOS field-effect transistors being connected to the bias voltage of the folded cascode current source, respectively; and the 14-bit counter having 14 output terminals thereof correspondingly connected to gates of 14 tubes of the thirteenth PMOS field-effect transistor, respectively; the thirteenth PMOS field-effect transistor having 14 output terminals thereof connected to 14 input nodes of the matched resistance module circuit, respectively; the thirteenth PMOS field-effect transistor having the output terminals thereof further connected to an input terminal of an RC filter circuit whose output is connected to a negative input terminal of the first comparator and a positive input terminal of the second comparator; the first comparator having a positive input terminal thereof connected to a voltage which is a maximum voltage to set the triangle wave; the first comparator having an output terminal thereof connected to a reset terminal of the 14-bit counter; the second comparator having a negative input terminal thereof connected to a duty ratio setting pin; and the second comparator outputting a PWM signal at an output terminal thereof.

2. The PWM signal generation and error calibration circuit of claim 1, wherein the first, the second, the third, the fourth, the fifth, the sixth, the seventh and the eighth PMOS field-effect transistors each have an even number of tubes, and have such a layout that the first and second PMOS field-effect transistors are centered and flanked from two sides by the third, the fourth, the fifth, and the sixth, the seventh, the eighth PMOS field-effect transistors successively, in which the first, the third, the fifth and the seventh PMOS field-effect transistors are symmetrically matched across a geometric center in the layout while the second, the fourth, the sixth and eighth PMOS field-effect transistors are symmetrically matched across the geometric center in the layout.

* * * * *